United States Patent
Utsumi et al.

(10) Patent No.: US 9,193,007 B2
(45) Date of Patent: Nov. 24, 2015

(54) COATED ROTARY TOOL AND METHOD FOR MANUFACTURING THE SAME

(71) Applicant: Sumitomo Electric Industries, Ltd., Osaka-shi (JP)

(72) Inventors: Yoshiharu Utsumi, Itami (JP); Hideki Moriguchi, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/126,283

(22) PCT Filed: Feb. 25, 2013

(86) PCT No.: PCT/JP2013/054784
§ 371 (c)(1),
(2) Date: Dec. 13, 2013

(87) PCT Pub. No.: WO2013/129321
PCT Pub. Date: Sep. 6, 2013

(65) Prior Publication Data
US 2014/0106177 A1  Apr. 17, 2014

(30) Foreign Application Priority Data
Feb. 29, 2012 (JP) ................. 2012-043983

(51) Int. Cl.
| | |
|---|---|
| C23C 26/00 | (2006.01) |
| B23K 20/12 | (2006.01) |
| C23C 30/00 | (2006.01) |
| C23C 14/06 | (2006.01) |
| C23C 14/32 | (2006.01) |

(52) U.S. Cl.
CPC ......... B23K 20/1255 (2013.01); C23C 14/0635 (2013.01); C23C 14/325 (2013.01); C23C 30/005 (2013.01); *Y10T 428/12028* (2015.01); *Y10T 428/31678* (2015.04)

(58) Field of Classification Search
USPC ............ 51/307, 309; 428/325, 469, 47
See application file for complete search history.

(56) References Cited

U.S. PATENT DOCUMENTS

| | | | |
|---|---|---|---|
| 5,718,541 A | * | 2/1998 | Bryant .................... 407/118 |
| 6,742,696 B2 | | 6/2004 | Thompson |
| 8,302,834 B2 | | 11/2012 | Nelson et al. |

(Continued)

FOREIGN PATENT DOCUMENTS

| | | |
|---|---|---|
| CN | 1194011 A | 9/1998 |
| CN | 1436110 A | 8/2003 |

(Continued)

OTHER PUBLICATIONS

Raekelboom et al "Structural investigations by the Rietveld method of sputtered tungsten carbide thin films" Thin Solid Films 517 (2009) p. 1555-1558.*

(Continued)

*Primary Examiner* — Archene Turner
(74) *Attorney, Agent, or Firm* — Venable LLP; Michael A. Sartori; Todd R. Farnsworth (57) ABSTRACT

A friction stir welding tool (1) of the present invention is used for friction stir welding, and includes: a base material (2); and a coating layer (3) formed on a surface of at least a portion of the base material (2) that is to be caused to contact workpieces during friction stir welding, the coating layer (3) containing cubic $WC_{1-x}$.

7 Claims, 1 Drawing Sheet

(56) References Cited

U.S. PATENT DOCUMENTS

| | | | |
|---|---|---|---|
| 8,833,633 B2* | 9/2014 | Miyazaki et al. | ............. 228/2.1 |
| 2005/0063827 A1 | 3/2005 | Ochiai et al. | |
| 2006/0035068 A1 | 2/2006 | Ochiai et al. | |
| 2006/0157451 A1 | 7/2006 | Uenishi et al. | |
| 2006/0157531 A1 | 7/2006 | Packer et al. | |
| 2006/0280597 A1 | 12/2006 | Ochiai et al. | |
| 2007/0187465 A1 | 8/2007 | Eyre et al. | |
| 2009/0142509 A1 | 6/2009 | Yamamoto | |
| 2010/0258612 A1 | 10/2010 | Kolbeck et al. | |
| 2010/0279146 A1 | 11/2010 | Rowe et al. | |
| 2014/0144972 A1 | 5/2014 | Takasugi et al. | |

FOREIGN PATENT DOCUMENTS

| | | | |
|---|---|---|---|
| CN | 1650047 A | | 8/2005 |
| CN | 1692179 A | | 11/2005 |
| CN | 1826478 A | | 8/2006 |
| CN | 101451228 A | | 6/2009 |
| JP | 06-262405 | * | 9/1994 |
| JP | 2002-155378 A | | 5/2002 |
| JP | 2003-326372 A | | 11/2003 |
| JP | 2005-152909 A | | 6/2005 |
| JP | 2005-199281 A | | 7/2005 |
| JP | 2008-155277 A | | 7/2008 |
| JP | 2008-202093 A | | 9/2008 |
| JP | 2009-155721 A | | 7/2009 |
| JP | 2010-520810 A | | 6/2010 |
| JP | 2010-168660 A | | 8/2010 |
| JP | 2011-011235 A | | 1/2011 |
| JP | 2011-504808 A | | 2/2011 |
| WO | WO-97/07251 A1 | | 2/1997 |
| WO | WO-01/85385 A1 | | 11/2001 |
| WO | WO-2004/29329 A1 | | 4/2004 |
| WO | WO-2004/33755 A1 | | 4/2004 |
| WO | WO-2009/147856 A1 | | 12/2009 |

OTHER PUBLICATIONS

Office Action in U.S. Appl. No. 14/125,882, dated Aug. 29, 2014.
International Search Report in PCT International Application No. PCT/JP2013/054784, dated May 21, 2013.
International Search Report in PCT International Application No. PCT/JP2013/054783, dated May 21, 2013.
U.S. Appl. No. 14/125,882, filed Dec. 12, 2013.
Office Action in U.S. Appl. No. 14/125,882, dated Dec. 3, 2014.
Notification of the First Office Action in Chinese Patent Application No. 201380001672.8 dated May 26, 2015.
Notification of the First Office Action in Chinese Patent Application No. 201380001685.5 dated Apr. 9, 2015.

* cited by examiner

COATED ROTARY TOOL AND METHOD FOR MANUFACTURING THE SAME

TECHNICAL FIELD

The present invention relates to a friction stir welding tool and a method for manufacturing the same.

BACKGROUND ART

In 1991, a friction stir welding technique of joining metal materials such as aluminum alloys together was established in the United Kingdom. This technique joins metal materials to each other in the following way. A cylindrical friction stir welding tool having a small-diameter protrusion formed at a tip thereof is pressed against joint surfaces of the metal materials to be joined. Meanwhile, the friction stir welding tool is rotated to thereby generate frictional heat. This frictional heat causes the metal materials of the joint portion to soften and plastically flow, and thereby joins the metal materials together.

"Joint portion" herein refers to a joint interface portion where joining of metal materials by butting the metal materials or placing one metal material on top of the other metal material is desired. Near this joint interface, the metal materials are caused to soften and plastically flow, and the metal materials are stirred. As a result, the joint interface disappears and the metal materials are joined. Simultaneously with the joining, dynamic recrystallization occurs to the metal materials. Due to this dynamic recrystallization, the metal materials near the joint interface become fine particles, and thus the metal materials can be joined with a high strength (Japanese Patent Laying-Open No. 2003-326372 (PTD 1)).

When aluminum alloys are used as the above-mentioned metal materials, plastic flow occurs at a relatively low temperature of approximately 500° C. Therefore, even when the friction stir welding tool made of an inexpensive tool steel is used, little wear and tear occurs and frequent replacement of the friction stir welding tool is unnecessary. Therefore, for the friction stir welding technique, the cost required to join the aluminum alloys is low. Thus, in place of a resistance welding method for melting and joining aluminum alloys, the friction stir welding technique has already been in practical use in various applications as a technique of joining parts of a railroad vehicle, a motor vehicle or an aircraft.

In order to improve the life of the friction stir welding tool, it is necessary to improve the wear resistance and the adhesion resistance of the friction stir welding tool. Friction stir welding uses frictional heat, which is generated by friction between the friction stir welding tool and the workpieces to be joined, to cause the workpieces to soften and plastically flow, and thereby join the workpieces together. Thus, in order to increase the joining strength to join the workpieces together, it is necessary to efficiently generate the frictional heat.

PTD 1, Japanese Patent Laying-Open No. 2005-199281 (PTD 2), and Japanese Patent Laying-Open No. 2005-152909 (PTD 3) each disclose an attempt to improve the tool life through improvements of the wear resistance and the adhesion resistance of the friction stir welding tool.

For example, a friction stir welding tool of PTD 1 has a diamond film coating on the surface of a base material formed of a cemented carbide or silicon nitride. Since the diamond film is excellent in hardness and wear resistance and has a low friction coefficient, workpieces are less likely to be adhered to the friction stir welding tool. Accordingly, the workpieces can successfully be joined together.

In contrast, according to PTD 2, a probe pin and a rotator, which constitute a part of the surface of a friction stir welding tool and are to be brought into contact with workpieces, are formed of a cemented carbide containing 5 to 18% by mass of Co Because of such a content of Co, the affinity of the friction stir welding tool for the workpieces is low and the workpieces are less likely to adhere to the tool. Moreover, since a cemented carbide having a thermal conductivity of 60 W/m·K or more is used for the base material, heat is likely to be released and diffused into the outside, and buckling of the rotator and the probe pin as well as thermal deformation of the joint of the workpieces hardly occur.

According to PTD 3, a friction stir welding tool has an anti-adhesion layer that is made of any of diamond-like carbon, TiN, CrN, TiC, SiC, TiAlN, and AlCrSiN and coats the surface of a portion of the tool that is to be brought into contact with workpieces. According to PTD 3, the tool also has an underlying layer made of any of TiN, CrN, TiC, SiC, TiAlN, and AlCrSiN and provided between a base material and the anti-adhesion layer to coat the base material. The underlying layer can thus be provided to enhance the adherence between the base material and the anti-adhesion layer, make the anti-adhesion layer less likely to crack, and improve the wear resistance. Moreover, diamond-like carbon to be used for the anti-adhesion layer has a low affinity for soft metals such as aluminum and is thus excellent in adhesion resistance.

CITATION LIST

Patent Document

PTD 1: Japanese Patent Laying-Open No. 2003-326372
PTD 2: Japanese Patent Laying-Open No. 2005-199281
PTD 3: Japanese Patent Laying-Open No. 2005-152909

SUMMARY OF INVENTION

Technical Problem

The diamond film of PTD 1 inherently has a large surface roughness. If the thickness of the diamond film is increased in order to enhance the wear resistance, the surface roughness is made still larger with the increase of the thickness of the diamond film. A resultant disadvantage is a considerably low adhesion resistance unless the surface of the diamond film is polished after the coating with the diamond film.

In addition, due to a very high thermal conductivity of the diamond film, frictional heat generated by friction between the tool and the workpieces is likely to escape into the outside, which makes it difficult to increase the temperature of the tool in an initial stage after the start of joining. Therefore, in the initial stage of joining, the workpieces are hindered from plastically flowing, and a stable joining strength fails to be achieved. Moreover, the diamond film involves a problem that, because the growth speed of the diamond film is slow, the manufacturing cost is accordingly high.

While the friction stir welding tool of PTD 2 has an advantage that the high content of Co makes the tool less likely to break, the tool is insufficient in terms of the adhesion resistance when used to join soft metals such as aluminum. Moreover, because PTD 2 uses a cemented carbide having a high thermal conductivity, the frictional heat escapes in the initial stage after the start of joining and thus a stable joining strength cannot be achieved.

As for PTD 3, diamond-like carbon used for the anti-adhesion layer has a very small friction coefficient and therefore frictional heat is difficult to be generated by friction between the tool and the workpieces. A resultant problem is therefore that the probe cannot be inserted in the workpieces or, even if the probe can be inserted in the workpieces, a long time is required for completion of joining. Moreover, a nitride-based anti-adhesion layer that is used as the anti-adhesion layer of PTD 3 is inadequate in terms of adhesion resistance to soft metals such as aluminum.

As seen from the foregoing, the friction stir welding tools of PTD 1 to PTD 3 all fail to successfully achieve both the stability of joining in the initial stage of joining and the adhesion resistance, and are required to have further improved wear resistance and chipping resistance.

The present invention has been made in view of the present circumstances as described above, and an object of the invention is to provide a friction stir welding tool that exhibits excellent adhesion resistance even when used to join soft metals, as well as excellent wear resistance, and provides a stable joining strength and a stable joining quality all along from the initial stage after the start of joining.

Solution to Problem

The inventors of the present invention have conducted thorough studies with the aim of improving the adhesion resistance of the friction stir welding tool to consequently find that a coating layer containing cubic $WC_{1-x}$ can be formed on a surface of a base material to thereby improve the adhesion resistance without reducing frictional heat. They have further found that the thermal conductivity, the WC particle size, and the Co content of a cemented carbide of which the base material is made can be optimized to provide excellent adhesion resistance even when soft metals are joined, as well as excellent wear resistance and chipping resistance, and accordingly a stable joining quality all along from the initial stage after the start of joining.

More specifically, a friction stir welding tool of the present invention is used for friction stir welding, and includes: a base material; and a coating layer formed on a surface of at least a portion of the base material that is to be caused to contact workpieces during friction stir welding, the coating layer containing cubic $WC_{1-x}$. Here, the base material is preferably a cemented carbide or a tool steel.

The coating layer is preferably formed by a physical vapor deposition method. The base material is preferably formed of a cemented carbide having a thermal conductivity of less than 60 W/m·K. The base material preferably contains WC having an average particle size of not less than 0.1 μm and not more than 1 μm, and preferably contains not less than 3% by mass and not more than 15% by mass of Co.

The coating layer subjected to x-ray diffraction preferably has I $(WC_{1-x})$/I $(W_2C)$ of not less than 2, where I $(WC_{1-x})$ is a higher one of respective diffracted beam intensities of (111) diffracted beam and (200) diffracted beam, and I $(W_2C)$ is a highest one of respective diffracted beam intensities of (1000) diffracted beam, (0002) diffracted beam, and (1001) diffracted beam.

Friction stir welding by means of the friction stir welding tool is preferably spot joining.

The present invention also provides a method for manufacturing a friction stir welding tool, including the step of forming, by a physical vapor deposition method, a coating layer on a surface of at least a portion of a base material that is to be caused to contact workpieces, the coating layer containing cubic $WC_{1-x}$.

Advantageous Effects of Invention

The friction stir welding tool of the present invention has the above-described configuration, and therefore exhibits superior effects that the tool has excellent adhesion resistance even when used to join soft metals, as well as excellent wear resistance and chipping resistance, and provides a stable joining quality all along from the initial stage after the start of joining.

DESCRIPTION OF EMBODIMENTS

The present invention will be described in more detail hereinafter.

<Friction Stir Welding Tool>

Figure 1:
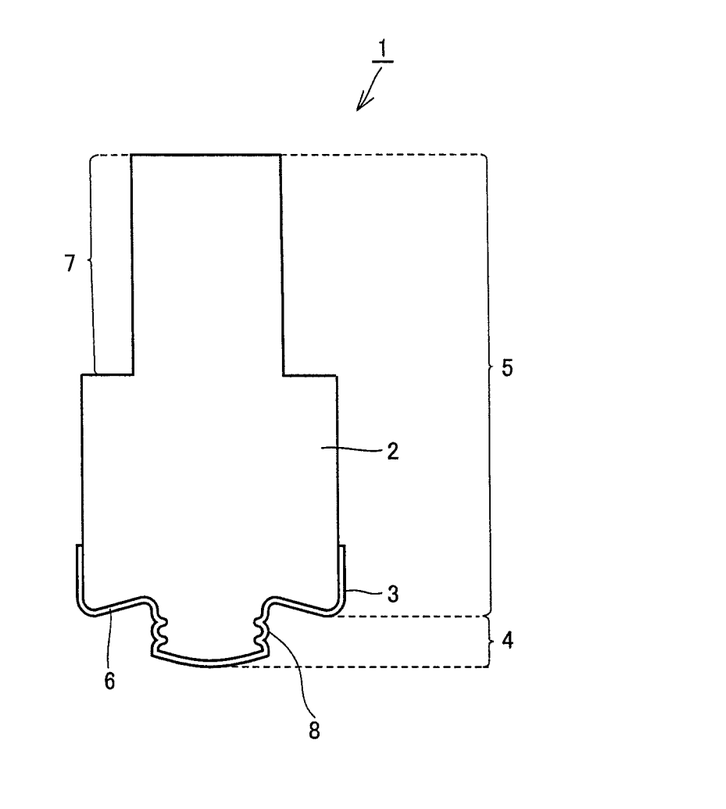
FIG. 1 is a schematic cross-sectional view showing one example of a friction stir welding tool according to the present invention.

FIG. 1 is a schematic cross-sectional view of a friction stir welding tool according to the present invention. As shown in FIG. 1, friction stir welding tool 1 of the present invention includes a base material 2 and a coating layer 3 formed on base material 2. Friction stir welding tool 1 of the present invention having the above-described configuration can be used very usefully for applications such as linear joining (friction stir welding FSW), spot joining (spot FSW), for example. Friction stir welding tool 1 of the present invention is shaped to include a probe portion 4 having a relatively small diameter (a diameter of not less than 2 mm and not more than 8 mm) and a cylindrical portion 5 having a relatively large diameter (a diameter of not less than 4 mm and not more than 20 mm). When this is used for joining, probe portion 4 inserted into or pressed against a joint portion of workpieces is rotated, and thereby the workpieces are joined together. In this case, for the linear joining application, probe portion 4 is pressed against or inserted into two workpieces that are stacked or butted in a line contact manner, and rotating probe portion 4 is moved linearly with respect to the stacked or butted portions, and thereby the workpieces are joined together. In contrast, for the spot joining application, rotating probe portion 4 is pressed against a desired joint spot of two workpieces that are stacked vertically or butted, and rotation of probe portion 4 is continued at this location, and thereby the workpieces are joined together.

As shown in FIG. 1, friction stir welding tool 1 of the present invention preferably has a chuck portion 7 so that cylindrical portion 5 is held in a holder. This chuck portion 7 can be formed by cutting away a part of the side of cylindrical portion 5, for example. As for a portion that is brought into contact with the workpieces during joining, this portion is referred to as a shoulder portion 6.

Preferably, the friction stir welding tool of the present invention has a helical screw thread portion 8 formed on the side of probe portion 4 as shown in FIG. 1. Screw thread portion 8 is thus provided to help cause the plastic flow of the workpieces, when the workpieces are soft metals such as aluminum as well, and enable stable joining of the workpieces all along from the initial stage after the start of joining. It should be noted that the friction stir welding tool of the present invention is applicable not only to a process of joining non-ferrous metals that are caused to plastically flow at a relatively low temperature, such as aluminum alloys and magnesium alloys, but also to a process of joining copper alloys or ferrous materials that are caused to plastically flow at a high temperature of 1000° C. or more. The friction stir welding tool of the present invention is also excellent in terms of adhesion resistance when used to join soft metals such as aluminum, aluminum alloys, magnesium, magnesium alloys, copper, and copper alloys.

<Base Material>

Base material 2 in the friction stir welding tool of the present invention preferably contains a cemented carbide (e.g., WC-based cemented carbide, a material containing Co in addition to WC, or the material to which carbonitride or the like of Ti, Ta, Nb or the like is further added). The cemented carbide may contain, in its structure, free carbon or an abnormal phase called η phase. The above-identified cemented carbide has a higher hardness relative to tool steels such as SKD and SKH that are used commonly for the base material of the friction stir welding tool, and is therefore advantageous in that it has excellent wear resistance. It should be noted that WC in the cemented carbide which forms the base material has a hexagonal crystal structure.

Preferably, the base material is a cemented carbide having a thermal conductivity of less than 60 W/m·K, which is more preferably 50 W/m·K or less, and still more preferably 40 W/m·K or less. The lower limit of the thermal conductivity is preferably 20 W/m·K or more, and more preferably 25 W/m·K or more. A cemented carbide having such a thermal conductivity can be used for the base material to make it less likely that frictional heat generated by friction escapes and accordingly facilitate raising the temperature of the workpieces, even when the rotational speed of the friction stir welding tool is low and the load for joining is small. Thus, the probe portion can be inserted into the workpieces in a short period of time, and accordingly the time taken for spot joining can be shortened. Particularly in the case of spot joining, the temperature of the friction stir welding tool sharply increases from the initial stage after the start of joining. In this case as well, stable joining strength can be achieved all along from the initial stage after the start of joining. A thermal conductivity of the cemented carbide of 60 W/m·K or more is not preferred, because the frictional heat generated by friction between the friction stir welding tool and the workpieces escapes, which hinders the temperature of the tool and the workpieces from increasing. In addition, because of the composition of the cemented carbide, a base material having a thermal conductivity of less than 20 W/m·K is difficult to produce. As "thermal conductivity" herein, a value is used that has been calculated based on the thermal diffusivity of the base material measured in accordance with the laser flash method as well as the specific heat and the density of the base material.

WC contained in the base material preferably has an average particle size of not less than 0.1 μm and not more than 1 μm. If the average particle size of WC is less than 0.1 μm, it is industrially difficult to prepare the cemented carbide. On the contrary, if it is more than 1 μm, the thermal conductivity may be 60 W/m·K or more depending on the case, which is therefore not preferred. Namely, in order for the cemented carbide to have a thermal conductivity of less than 60 W/m·K, it is necessary that the average particle size of WC be 1 μm or less. In the case where the screw thread is formed on the probe portion, WC having an average particle size of 1 μm or less makes it less likely that the apex of the screw thread is chipped, and thereby improves the life of the friction stir welding tool. The average particle size of WC is more preferably 0.2 μm or more and 0.7 μm or less. An average particle size of WC of 0.7 μm or less makes the thermal conductivity of the base material still smaller, and therefore makes it still less likely that frictional heat escapes. Thus, the life of the friction stir welding tool can be improved, the time taken for joining can also be shortened, and the strength of joining is stable all along from the initial stage after the start of joining. On the contrary, an average particle size of WC of 0.2 μm or more has an advantage that preparation of the cemented carbide in an industrial production process is facilitated.

As the above-indicated average particle size of the WC particles, the value of measurement taken in the following way is used. First, a scanning electron microscope (SEM) and an associated wavelength dispersive x-ray analysis (EPMA: Electron Probe Micro-Analysis) are used to map WC particles and other components in a base material's cross section (a plane perpendicular to the direction of the leading end of the probe portion). Next, the number of WC particles that are present on an arbitrary line of 20 μm in the cross section is counted, and the total length of regions occupied by the WC particles respectively on that line is measured. Subsequently, the total length thus measured is divided by the number of the WC particles and the determined value of the quotient is the particle size of the WC particles. For three arbitrary lines, measurements are taken in a similar manner to determine respective particle sizes of individual WC particles, and the average of them is determined for use as the average particle size of the WC particles.

The cemented carbide forming the base material preferably contains not less than 3% by mass and not more than 15% by mass of Co, more preferably contains not less than 6% by mass and not more than 12% by mass of Co, and still more preferably contains not less than 8% by mass and not more than 10% by mass of Co. A Co content of more than 15% by mass is not preferred because it causes deterioration of the wear resistance. A Co content of less than 3% by mass is not preferred because it causes deterioration of the breakage resistance, which may result in chipping of the screw thread of the probe portion and, in the case of linear joining, may result in breakage of the probe portion.

The Co content in the cemented carbide is herein a value determined in the following way. The friction stir welding tool is mirror-polished, the crystal structure forming an arbitrary region of the base material is photographed at a magnification of 10000× by the SEM, the associated EPMA is used to map the Co component in a base material's cross section (a plane perpendicular to the direction of the leading end of the probe portion), and the total area of Co in the photograph is converted into the mass ratio, which is used as the Co content.

For the base material of the friction stir welding tool of the present invention, tool steels such as SKD and SKH may also be used. While these materials are lower in wear resistance relative to the cemented carbide, they have the advantages of excellent workability and low cost.

It should be noted that, for the base material of the friction stir welding tool of the present invention, known materials including refractory metal alloys such as Co-based alloys, Mo alloys, W—Re alloy, and Ir alloys, cBN (cubic boron nitride) sintered body, ceramics such as silicon nitride, aluminum nitride, SiAlON, and the like may be used, in addition to the above-described cemented carbide and tool steels.

<Coating Layer>

In the friction stir welding tool of the present invention, coating layer 3 is characterized by being formed, as shown in FIG. 1, on base material 2 in such a manner that the coating layer is formed on at least a portion that is to be caused to contact workpieces during friction stir welding. Thus, coating layer 3 is formed on the portion to be caused to contact the workpieces, and accordingly hinders heat generated by friction from being transmitted to base material 2. In this way, plastic deformation of base material 2 can be prevented and the tool life can be extended. In addition, the coating layer is formed at this position to thereby hinder soft-metal workpieces from adhering to the tool and accordingly improve the wear resistance, and also help generation of frictional heat.

The coating layer is characterized by its containing cubic $WC_{1-x}$. Cubic $WC_{1-x}$ is superior to nitrides such as TiN and CrN as well as TiC and SiC in terms of adhesion resistance, and therefore, soft metals such as aluminum are less likely to adhere thereto. In addition, the friction coefficient of cubic $WC_{1-x}$ is not as low as the friction coefficient of diamond-like carbon (DLC) Therefore, regarding the friction stir welding tool including the coating layer made of cubic $WC_{1-x}$, generation of the friction heat by friction with workpieces is facilitated. Moreover, cubic $WC_{1-x}$ has an advantage that it has a high hardness and is therefore superior in wear resistance. WC in the cemented carbide of the tool's base material has a hexagonal crystal structure. In contrast, cubic $WC_{1-x}$ has a cubic NaCl type crystal structure. Here, 1−x of $WC_{1-x}$ means that C is less than 1 in the stoichiometric composition of WC. In accordance with a W-C binary equilibrium diagram, cubic $WC_{1-x}$ is present in a limited region, and x of $WC_{1-x}$ is said to be 0.3 to 0.4 at 2380±30° C. to 2747±12° C.

According to the present invention, while the coating layer may contain $W_2C$ as another tungsten carbide other than cubic $WC_{1-x}$, it is preferable that $W_2C$ is not contained as far as possible because the hardness of $W_2C$ is low. Here, the crystal structure of the tungsten carbide contained in the coating layer can be confirmed through x-ray diffraction. Diffracted beams of cubic $WC_{1-x}$ correspond to those in JCPDS card 20-1316.

The coating layer subjected to x-ray diffraction has I $(WC_{1-x})/I (W_2C)$ of preferably not less than 2, where I $(WC_{1-x})$ is a higher one of respective diffracted beam intensities of (111) diffracted beam and (200) diffracted beam, and I $(W_2C)$ is a highest one of respective diffracted beam intensities of (1000) diffracted beam, (0002) diffracted beam, and (1001) diffracted beam. This ratio is more preferably 5 or more, and still more preferably 10 or more. The coating layer can contain cubic $WC_{1-x}$ at this ratio to thereby have a higher hardness, so that the wear resistance and the chipping resistance of the friction stir welding tool can be improved.

The coating layer of the present invention preferably has a thickness of not less than 1 μm and not more than 20 μm. This thickness of 1 μm or more enables the wear resistance to be improved and the tool life to remarkably be extended. The coating layer of the present invention has a thickness of more preferably not less than 2 μm and not more than 15 μm, and still more preferably not less than 3 μm and not more than 10 μm. Accordingly, the tool life can further be extended, and the chipping resistance can be made higher.

It should be noted that the thickness of the coating layer of the present invention is herein the thickness of the coating layer of any portion of the surface of the friction stir welding tool, and is for example the thickness of the coating layer at the leading end of the probe, of the thickness of the whole coating layer formed on the base material of the friction stir welding tool.

The coating layer of the present invention may be formed to cover the whole surface of the base material, or a part of the base material may not be covered with the coating layer, or the structure of the coating layer may be different depending on the location on the base material, which, however, does not go beyond the scope of the present invention.

<Method for Forming Coating Layer>

According to the present invention, the coating layer may be formed by any of known techniques including physical vapor deposition methods such as sputtering method and vacuum arc vapor deposition method, chemical vapor deposition methods such as thermal CVD method, plasma spraying method, and the like.

The coating layer is preferably formed by the physical vapor deposition method, among other methods mentioned above. A coating layer fabricated by the physical vapor deposition method has a high content of cubic $WC_{1-x}$ and a dense crystal structure, and accordingly has the advantages of excellent wear resistance and chipping resistance. While the physical vapor deposition method includes, for example, sputtering method, ion plating method, and the like, particularly a cathode arc ion plating method providing a high ionization rate of raw material elements can be used to produce a dense and high-hardness film having excellent wear resistance, and is therefore more preferred. In addition, this method is preferred since metal or gas ion bombardment treatment can be performed on the surface of the base material before the coating layer is formed, which remarkably improves adherence between the base material and the coating layer.

As seen from the foregoing, the method for manufacturing a friction stir welding tool according to the present invention includes the step of forming, by a physical vapor deposition method performed on a base material formed of a cemented carbide, a coating layer on a surface of at least a portion of the base material that is to be caused to contact workpieces, and the coating layer contains cubic $WC_{1-x}$.

EXAMPLES

In the following, the present invention will be described in more detail with reference to Examples. The present invention, however, is not limited to them. It should be noted that the thickness of the coating layer in the Examples was measured by directly observing a cross section of the coating layer by means of a scanning electron microscope (SEM).

For Examples 1 to 14 each, a friction stir welding tool as shown in FIG. 1 was fabricated. First, for the base material, a cemented carbide having characteristics "WC average particle size," "Co content," and "thermal conductivity" shown in Table 1 below was prepared. The cemented carbide was subjected to grinding to form base material 2 of the shape as shown in FIG. 1. This base material 2 included cylindrical portion 5 of a substantially cylindrical shape with a diameter of 10 mm, and probe portion 4 protruding concentrically with cylindrical portion 5 from the center of shoulder portion 6 of cylindrical portion 5. The length from shoulder portion 6 to the leading end of probe portion 4 was 1.5 mm. On the side of probe portion 4, screw thread portion 8 was formed, which was specifically a helical screw thread (M4) threaded in the opposite direction relative to the rotational direction of the tool and at a pitch of 0.7 mm.

The friction stir welding tools for the Examples and Comparative Examples each had probe portion 4 and shoulder portion 6 as shown in FIG. 1, and also had chuck portion 7 so that cylindrical portion 5 was held in a holder. Chuck portion 7 was formed in the following way. Along a portion of 10 mm from the top surface of cylindrical portion 5, the side of cylindrical portion 5 was partially cut away in two directions opposite to each other, and the resultant cross section was substantially circular. Chuck portion 7, as seen from the holder, had chords formed after the cylindrical portion was partially cut away, and the chords both had a length of 7 mm.

Examples 1 to 7

For Examples 1 to 7 each, the vacuum arc vapor deposition method was used to form a coating layer. The coating layer was formed by the vacuum arc vapor deposition method through the following procedure. It should be noted that while the thickness of the coating layer of Examples 1 to 7 is 2 μm, it has been confirmed that effects equivalent to those of each Example can be obtained as long as the thickness of the coating layer falls in a range of 1 μm to 20 μm.

First, the base material was set on a base material holder in a chamber of a vacuum arc vapor deposition apparatus, and WC sintered body containing no Co was set as a target of a metal evaporation source. Then, a vacuum pump was used to reduce the pressure in the chamber, a heater installed in the apparatus was used to heat the base material to a temperature of 450° C., and the chamber was evacuated until the pressure in the chamber reached $1.0 \times 10^{-4}$ Pa.

Next, argon gas was introduced, the pressure in the chamber was kept at 3.0 Pa, the voltage of a bias power source for the base material was gradually increased to −1500 V, and W filament was heated to release thermal electrons to clean the surface of the base material for 15 minutes. After this, argon gas was discharged. Next, argon gas and methane gas were introduced to set the pressure in the chamber to 3 Pa, the partial pressure of the methane gas was set to 1 Pa, and the DC bias voltage for the base material was set to −50 V. Then, the WC target was ionized with arc current 200 A, to thereby form a coating layer containing cubic $WC_{1-x}$.

Examples 8 to 14

For Examples 8 to 14, a UBM sputtering method was used to form a coating layer. The coating layer was formed by the UBM sputtering method through the following procedure. It should be noted that while the thickness of the coating layer of Examples 8 to 14 is 2 μm, it has been confirmed that effects equivalent to those of each Example can be obtained as long as the thickness of the coating layer falls in a range of 1 μm to 20 μm.

First, the base material was set on a base material holder in a chamber of a sputtering vapor deposition apparatus, and WC sintered body containing no Co was set as a target of a metal evaporation source. Then, a vacuum pump was used to reduce the pressure in the chamber, a heater installed in the apparatus was used to heat the base material to a temperature of 450° C., and the chamber was evacuated until the pressure in the chamber reached $1.0 \times 10^{-4}$ Pa.

Next, argon gas was introduced, the pressure in the chamber was kept at 3.0 Pa, the DC bias voltage for the base material was gradually increased to −1000 V, and cleaning of the surface of the base material was performed for 15 minutes. After this, argon gas was discharged. Next, argon gas and methane gas were introduced at a flow-rate ratio of 1:1 to thereby set the pressure in the chamber to 0.6 Pa, and the DC bias voltage for the base material was set to −90 V. Then, DC sputtering power of 4500 W was applied to the WC target to ionize the target and thereby form a coating layer containing cubic $WC_{1-x}$.

Comparative Examples 1 to 2

For Comparative Examples 1 to 2 each, a cemented carbide having characteristics shown in Table 1 below was used for the base material, a friction stir welding tool was fabricated by means of grinding in a similar way to the Examples, and the coating layer was not formed on the base material.

Comparative Example 3

For Comparative Example 3, a friction stir welding tool was fabricated in a similar way to Example 1, except that a cemented carbide having characteristics shown in Table 1 below was used for a base material and the vacuum arc vapor deposition method was used to form a coating layer made of TiN. The coating layer was formed by the vacuum arc vapor deposition method through the following procedure.

First, the base material was set on a base material holder in a chamber of a vacuum arc vapor deposition apparatus, and Ti was set as a target of a metal evaporation source. Then, vacuum was generated and cleaning was performed in a similar manner to Example 1. Next, nitrogen gas was introduced to set the pressure in the chamber to 3.0 Pa, and the voltage of a base-material DC bias power source was set to −50 V. Then, the Ti target was ionized with arc current 200 A, to thereby cause Ti and $N_2$ gas to react with each other and form a coating layer made of TiN on the base material.

Comparative Example 4

For Comparative Example 4, a CrN coating layer was formed on the base material in a similar manner to Comparative Example 3, except that Ti of Comparative Example 3 was replaced with Cr.

Comparative Example 5

For Comparative Example 5, a friction stir welding tool was fabricated in a similar way to Comparative Example 3, except that a coating layer made of diamond-like carbon (DLC) was formed by means of a plasma CVD method. The coating layer was formed by the plasma CVD method through the following procedure.

First, the base material was set on a base material holder in a chamber of a plasma CVD apparatus. Then, a vacuum pump was used to reduce the pressure in the chamber, a heater installed in the apparatus was used to heat the base material to a temperature of 200° C., and the chamber was evacuated until the pressure in the chamber reached $1.0 \times 10^{-3}$ Pa.

Next, argon gas was introduced, the pressure in the chamber was kept at 3.0 Pa, and high-frequency power 500 W was applied to the base material holder, to clean the surface of the base material for 60 minutes. After this, the chamber was evacuated, and thereafter $CH_4$ was introduced so that the pressure in the chamber was 10 Pa. Next, high-frequency power 400 W was applied to the base material holder to form a coating layer made of DLC.

TABLE 1

|  | base material | | | coating layer | | |
|---|---|---|---|---|---|---|
|  | WC average particle size (μm) | Co content (mass %) | thermal conductivity (W/m·K) | crystal structure/composition | coating method | $I(WC_{1-x})/I(W_2C)$ |
| Example 1 | 0.1 | 10 | 20 | cubic $WC_{1-x} + W_2C$ | vacuum arc vapor deposition | 10.5 |
| Example 2 | 0.2 | 9 | 22 | cubic $WC_{1-x} + W_2C$ | vacuum arc vapor deposition | 11.8 |
| Example 3 | 0.5 | 2 | 58 | cubic $WC_{1-x} + W_2C$ | vacuum arc vapor deposition | 10.2 |

TABLE 1-continued

| | base material | | | coating layer | | |
|---|---|---|---|---|---|---|
| | WC average particle size (μm) | Co content (mass %) | thermal conductivity (W/m · K) | crystal structure/composition | coating method | $I(WC_{1-x})/I(W_2C)$ |
| Example 4 | 0.5 | 3 | 49 | cubic $WC_{1-x} + W_2C$ | vacuum arc vapor deposition | 10.7 |
| Example 5 | 0.5 | 8 | 43 | cubic $WC_{1-x} + W_2C$ | vacuum arc vapor deposition | 11.5 |
| Example 6 | 0.5 | 12 | 39 | cubic $WC_{1-x} + W_2C$ | vacuum arc vapor deposition | 12.0 |
| Example 7 | 0.5 | 15 | 36 | cubic $WC_{1-x} + W_2C$ | vacuum arc vapor deposition | 11.2 |
| Example 8 | 0.5 | 17 | 33 | cubic $WC_{1-x} + W_2C$ | UBM sputtering | 5.2 |
| Example 9 | 0.7 | 5 | 67 | cubic $WC_{1-x} + W_2C$ | UBM sputtering | 6.7 |
| Example 10 | 0.7 | 13 | 47 | cubic $WC_{1-x} + W_2C$ | UBM sputtering | 7.5 |
| Example 11 | 1 | 5 | 80 | cubic $WC_{1-x} + W_2C$ | UBM sputtering | 6.1 |
| Example 12 | 1 | 10 | 67 | cubic $WC_{1-x} + W_2C$ | UBM sputtering | 8.0 |
| Example 13 | 1 | 13 | 62 | cubic $WC_{1-x} + W_2C$ | UBM sputtering | 7.7 |
| Example 14 | 1.2 | 6 | 82 | cubic $WC_{1-x} + W_2C$ | UBM sputtering | 5.0 |
| Comparative Example 1 | 0.5 | 8 | 43 | — | — | — |
| Comparative Example 2 | 2 | 17 | 75 | — | — | — |
| Comparative Example 3 | 0.5 | 8 | 43 | TiN | vacuum arc vapor deposition | — |
| Comparative Example 4 | 0.5 | 8 | 43 | CrN | vacuum arc vapor deposition | — |
| Comparative Example 5 | 0.5 | 8 | 43 | DLC | plasma CVD | — |

The value of "thermal conductivity" in Table 1 was calculated based on the thermal diffusivity of the base material measured by means of the laser flash method, as well as the specific heat and the density of the base material. The value of the thermal diffusivity was obtained by using a laser flash apparatus (xenon flash analyzer LFA447 (manufactured by NETZSCH)) to measure a sample having a size of Φ8 mm×thickness 1.5 mm.

The friction stir welding tools of the Examples and Comparative Examples thus obtained were each mirror-polished, and the base material in an arbitrary region was photographed at a magnification of 10000× by an SEM, and an associated EPMA was used to map the Co component in a base material's cross section (a plane perpendicular to the direction of the leading end of the probe portion). Then, for the 10000× photograph thus taken, image processing software was used to calculate the total area of Co and meanwhile, the components were identified. The Co ratio to the base material in the photograph was converted into the mass ratio by percentage, to thereby calculate the mass percentage of Co in the base material. The results are shown under "Co content" in Table 1.

Further, the number of WC particles on an arbitrary line of 20 μm in the cross section of the base material was counted, and the total length of regions occupied by the WC particles respectively on that line was measured. The total length thus measured was divided by the number of the WC particles and the determined value of the quotient was the particle size of the WC particles. For three arbitrary lines, measurements were taken in a similar manner to determine respective particle sizes of individual WC particles. The results are shown under "WC average particle size" in Table 1.

The coating layer formed for each Example was analyzed based on XRD (x-ray diffraction), observation of a cross section with an SEM, and EPMA. The results are shown in the column under "crystal structure/composition" in Table 1. It should be noted that, regarding "cubic $WC_{1-x}$" in Table 1, the value of x is not specified since the coating layer also contains $W_2C$ and the ratio therebetween is difficult to quantify. As clearly seen from Table 1, it has been confirmed that the friction stir welding tool of each Example has the coating layer made of cubic $WC_{1-x}$ and $W_2C$. In contrast, on the surface of the friction stir welding tool of Comparative Examples 1 to 2 each, the coating layer containing cubic $WC_{1-x}$ was not present, and a cemented carbide made of the same hexagonal WC and Co as those in the base material was identified.

Furthermore, the peak intensity ratio $I(WC_{1-x})/I(W_2C)$ between cubic $WC_{1-x}$ and $W_2C$ forming the coating layer was calculated based on XRD (x-ray diffraction). Here, $I(WC_{1-x})$ is a higher one of respective diffracted beam intensities of (111) diffracted beam and (200) diffracted beam, and $I(W_2C)$ is a highest one of respective diffracted beam intensities of (1000) diffracted beam, (0002) diffracted beam, and (1001) diffracted beam. The results are shown in the column under "$I(WC_{1-x})/I(W_2C)$" in Table 1.

<Evaluation of Friction Stir Welding Tool (Spot Joining Test)>

Each of the friction stir welding tools of the Examples and Comparative Examples thus fabricated was used to conduct a spot joining test by doing 100,000 strokes of spot joining. Workpieces were two sheets of aluminum alloy A5052 each having a thickness of 1 mm. These workpieces were laid on each other and the test was performed under friction stir welding conditions that the tool load was 400 kgf, the tool rotational speed was 3000 rpm, and the time for joining was 2.0 seconds. Based on this, the adhesion resistance, the wear resistance, the chipping resistance, and the stability of the joining strength in an initial stage after the start of joining were evaluated. In the case where adhesion of the workpieces was confirmed before 100,000 strokes of spot joining, the spot joining test was stopped at this time. The following is a description of how the above items were each evaluated. The following evaluation results are each shown in the column under "spot joining evaluation" in Table 2.

Evaluation of Adhesion Resistance

The adhesion resistance was evaluated in the following manner. Each time 5,000 strokes of spot joining were done, the friction stir welding tool was removed and a microscope was used to confirm whether the workpieces had adhered to the tool. The time when adhesion of the workpieces was confirmed is indicated in the column under "state of occurrence of adhesion" in Table 2. In the case where adhesion of the workpieces was not confirmed even after 100,000 strokes of spot joining, this was evaluated as "no adhesion." In the case of occurrence of adhesion, a greater number of strokes of spot joining in the column "state of occurrence of adhesion" represents a higher adhesion resistance.

Evaluation of Wear Resistance

The wear resistance was evaluated based on the decrease of the diameter of the probe portion at the time when 100,000 strokes of spot joining were completed. The diameter of the probe portion after 100,000 strokes of spot joining was measured with a vernier caliper to thereby calculate the amount of wear of the probe portion. The results are shown in the column under "variation of probe diameter" in Table 2. A smaller variation of the probe diameter means that the tool is less likely to wear and has higher wear resistance. Regarding Comparative Examples 1 to 5, adhesion of the workpieces was confirmed before 100,000 strokes of spot joining, and therefore, evaluation of the wear resistance was not done.

Evaluation of Chipping Resistance

The chipping resistance was evaluated in the following manner. After 100,000 strokes of spot joining, a microscope was used to observe the probe portion and the screw thread portion to confirm the state of fracture of the probe portion and the screw thread portion. Regarding Comparative Examples 1 to 5, adhesion of the workpieces was confirmed before 100,000 strokes of spot joining, and therefore, evaluation of the chipping resistance was not done. The results are shown in the column under "state of fracture" in Table 2.

Evaluation of Stability of Joining Strength

The stability of the joining strength in an initial stage after the start of joining was evaluated in the following manner. A micrometer was used to measure the remaining thickness of the lower one of spot-joined workpieces. The number of strokes of spot joining required to be done for the remaining thickness of the lower workpiece to become 0.5 mm or less was used for evaluation. More specifically, in the present spot joining test, it was determined that the joining strength was stable when the remaining thickness of the lower workpiece was 0.5 mm or less, since the total thickness of the workpieces was 2 mm and the length of the friction stir welding tool from the surface of the shoulder portion to the leading end of the probe portion was 1.5 mm, and thus the probe portion was completely inserted in the workpieces when the remaining thickness was 0.5 mm or less. A smaller number of strokes of spot joining required to be done for the remaining thickness to become 0.5 mm or less means that the joining strength was more stable all along from the initial stage after the start of joining.

<Evaluation of Friction Stir Welding Tool (Linear Joining Test)>

Each of the friction stir welding tools of the Examples and Comparative Examples thus fabricated was used to perform linear butt-joining on workpieces, specifically sheets of aluminum alloy A6061 of 2 mm in thickness, under the friction stir welding conditions that the tool rotational speed was 2000 rpm and the joining rate was 1000 mm/min, until a linear joint of 1000 m was formed. Based on this, the adhesion resistance, the wear resistance, and the chipping resistance were evaluated. In the case where adhesion of the workpieces was confirmed before the joint of 1000 m was formed, the linear joining test was stopped at this time. The following evaluation results are shown in the columns under "linear joining evaluation" in Table 2.

Evaluation of Adhesion Resistance

The adhesion resistance was evaluated in the following manner. Each time a linear joint of 100 m was formed, the friction stir welding tool was removed and a microscope was used to confirm whether the workpieces had adhered to the tool. The time when adhesion of the workpieces was confirmed is indicated in the column under "state of occurrence of adhesion" in Table 2. In the case where adhesion of the workpieces was not confirmed even after a linear joint of 1000 m was formed, this was evaluated as "no adhesion." A greater numerical value of the length of the joint in the column "state of occurrence of adhesion" represents a higher adhesion resistance.

Evaluation of Wear Resistance

The wear resistance was evaluated based on the decrease of the diameter of the probe portion at the time when a linear joint of 1000 m was completed. The diameter of the probe portion after the linear joint of 1000 m was formed was measured with a vernier caliper to thereby calculate the amount of wear of the probe portion. The results are shown in the column under "variation of probe diameter" in Table 2. A smaller variation of the probe diameter means that the tool is less likely to wear and has higher wear resistance. Regarding Comparative Examples 1 to 5, adhesion of the workpieces was confirmed before the linear joint of 1000 m was formed, and therefore, evaluation of the wear resistance was not done.

Evaluation of Chipping Resistance

The chipping resistance was evaluated in the following manner. After a linear joint of 1000 m was formed, a microscope was used to observe the probe portion and the screw thread portion to confirm the state of fracture of the probe portion and the screw thread portion. Regarding Comparative Examples 1 to 5, adhesion of the workpieces was confirmed before the linear joint of 1000 m was formed, and therefore, evaluation of the chipping resistance was not done. The results are shown in the column under "state of fracture" in Table 2.

TABLE 2

|  | spot joining evaluation | | | | linear joining evaluation | | |
| --- | --- | --- | --- | --- | --- | --- | --- |
|  | state of occurrence of adhesion | variation of probe diameter | state of fracture | number of strokes for remaining thickness of lower workpiece to become 0.5 mm | state of occurrence of adhesion | variation of probe diameter | state of fracture |
| Example 1 | no adhesion | 0.01 mm or less | no damage | 1 | no adhesion | 0.01 mm or less | no damage |
| Example 2 | no adhesion | 0.01 mm or less | no damage | 1 | no adhesion | 0.01 mm or less | no damage |

TABLE 2-continued

|  | spot joining evaluation | | | | linear joining evaluation | | |
| --- | --- | --- | --- | --- | --- | --- | --- |
|  | state of occurrence of adhesion | variation of probe diameter | state of fracture | number of strokes for remaining thickness of lower workpiece to become 0.5 mm | state of occurrence of adhesion | variation of probe diameter | state of fracture |
| Example 3 | no adhesion | 0.01 mm or less | partially lost | 1 | no adhesion | 0.01 mm or less | partially lost |
| Example 4 | no adhesion | 0.01 mm or less | no damage | 1 | no adhesion | 0.01 mm or less | no damage |
| Example 5 | no adhesion | 0.01 mm or less | no damage | 1 | no adhesion | 0.01 mm or less | no damage |
| Example 6 | no adhesion | 0.01 mm or less | no damage | 1 | no adhesion | 0.01 mm or less | no damage |
| Example 7 | no adhesion | 0.01 mm or less | no damage | 1 | no adhesion | 0.01 mm or less | no damage |
| Example 8 | no adhesion | 0.03 mm | no damage | 1 | no adhesion | 0.04 mm | no damage |
| Example 9 | no adhesion | 0.01 mm or less | no damage | 4 | no adhesion | 0.01 mm or less | no damage |
| Example 10 | no adhesion | 0.01 mm or less | no damage | 1 | no adhesion | 0.01 mm or less | no damage |
| Example 11 | no adhesion | 0.01 mm or less | no damage | 5 | no adhesion | 0.01 mm or less | no damage |
| Example 12 | no adhesion | 0.01 mm or less | no damage | 4 | no adhesion | 0.01 min or less | no damage |
| Example 13 | no adhesion | 0.01 mm or less | no damage | 3 | no adhesion | 0.01 mm or less | no damage |
| Example 14 | no adhesion | 0.01 mm or less | no damage | 5 | no adhesion | 0.01 mm or less | no damage |
| Comparative Example 1 | adhesion occurred in 15000 strokes | — | — | 1 | adhesion occurred in 300 m | — | — |
| Comparative Example 2 | adhesion occurred in 10000 strokes | — | — | 5 | adhesion occurred in 200 m | — | — |
| Comparative Example 3 | adhesion occurred in 10000 strokes | — | — | 1 | adhesion occurred in 200 m | — | — |
| Comparative Example 4 | adhesion occurred in 15000 strokes | — | — | 1 | adhesion occurred in 300 m | — | — |
| Comparative Example 5 | adhesion occurred in 30000 strokes | — | — | 8 | adhesion occurred in 300 m | — | — |

<Result of Evaluation of Adhesion Resistance>

Regarding the friction stir welding tools of Examples 1 to 14, adhesion of the workpieces did not occur even after 100,000 strokes of spot joining, as shown under "state of occurrence of adhesion" under the spot joining evaluation in Table 2, and thus these tools were all excellent in adhesion resistance. Further, as shown under "state of occurrence of adhesion" under the linear joining evaluation in Table 2, adhesion of the workpieces did not occur after a linear joint of 1000 m was formed, and thus these tools were all excellent in adhesion resistance. The reason why the Examples were each excellent in adhesion resistance is considered to be the fact that, in all of the Examples, the coating layer containing cubic $WC_{1-x}$ was formed on the surface of the portion of the base material that was caused to contact the workpieces.

In contrast, regarding Comparative Examples 1 to 5, adhesion of the workpieces occurred before 100,000 strokes of spot joining were done or a linear joint of 1000 m was formed, as shown under "state of occurrence of adhesion" in Table 2. The reason why the adhesion resistance of Comparative Examples 1 and 2 was thus low is considered to be the fact that the coating layer was not formed. As to Comparative Examples 3 to 5 as well, the fact that the coating layer did not contain cubic $WC_{1-x}$ is considered to be a reason for adhesion of the workpieces.

<Result of Evaluation of Wear Resistance>

As shown under "variation of probe diameter" under the spot joining evaluation in Table 2, all of the Examples except for Example 8 had a variation of the probe diameter of 0.01 mm or less after 100,000 strokes of spot joining, and were thus excellent in wear resistance. Further, as shown under "variation of probe diameter" under the linear joining evaluation in Table 2, all of the Examples except for Example 8 had a variation of the probe diameter of 0.01 mm or less after a linear joint of 1000 m was formed, and were thus excellent in wear resistance. The reason why these Examples had excellent wear resistance is considered to be the fact that the content of Co contained in the base material was 15% by mass or less in all of the Examples except for Example 8. In contrast, as to Example 8, the fact that the Co content exceeded 15% by mass (17% by mass) is considered to be a reason for the lower wear resistance and the variation of the probe diameter exceeding 0.01 mm.

<Result of Evaluation of Chipping Resistance>

As shown under "state of fracture" under the spot joining evaluation in Table 2, all of the Examples except for Example 3 had no damage to the probe portion and the screw thread portion even after 100,000 strokes of spot joining, and were thus excellent in chipping resistance. As shown under "state of fracture" under the linear joining evaluation in Table 2, all of the Examples except for Example 3 had no damage to the probe portion and the screw thread portion even after a linear joint of 1000 m was formed, and were thus excellent in chipping resistance. The reason why these Examples had excellent chipping resistance is considered to be the fact that the content of Co contained in the base material was 3% by mass or more in all of the Examples except for Example 3. In contrast, as to Example 3, the fact that the Co content was less than 3% by mass (2% by mass) is considered to be a reason for the lower chipping resistance and occurrence of chipping to the probe portion or the screw thread portion. Specifically, in Example 3, a part of the screw thread portion had been lost at the time after 50,000 strokes of spot joining were done. Further, in Example 3, a part of the screw thread portion had been lost at the time after a linear joint of 1000 m was formed.

As seen from the results indicated under "number of strokes for remaining thickness of lower workpiece to become 0.5 mm" in Table 2, all of the Examples except for Examples 9 and 11 to 14 had a remaining thickness of the lower workpiece of 0.5 mm or less at the time when the first stroke of spot joining was done, which means that joining could be performed with a stably high joining strength all along from the initial stage of joining. The reason for this is considered to be the fact that all of the Examples except for Examples 9 and 11 to 14 used a base material including a cemented carbide having a thermal conductivity of less than 60 W/m·K, and therefore, increase of the tool temperature was facilitated. In contrast, Examples 9 and 11 to 14 used a base material including a cemented carbide having a thermal conductivity of 60 W/m·K or more, and therefore, increase of the tool temperature was hindered and the remaining thickness of the lower workpiece was more than 0.5 mm when the first/second stroke of spot joining was done.

In contrast, regarding the friction stir welding tool of Comparative Example 5, the coefficient of friction between the workpieces and diamond-like carbon forming the coating layer was low, which hindered generation of the frictional heat and accordingly the remaining thickness of the lower workpiece became 0.5 mm or less at the time when the eighth stroke of spot joining was done. As seen from the above, the coating layer made of diamond-like carbon results in a low joining stability in the initial stage after the start of joining.

From the foregoing results, it has been confirmed that the friction stir welding tools of Examples 1 to 14 according to the present invention are superior in adhesion resistance, wear resistance, and chipping resistance as compared with the friction stir welding tools of Comparative Examples 1 to 5, and achieve stable joining all along from the initial stage after the start of joining.

Examples 15 to 18 and Comparative Examples 6 to 7

In a similar manner to Examples 1 to 14, the vacuum arc vapor deposition method or the UBM sputtering method was used to form a coating layer on a base material. It should be noted that Examples 15 and 16 used SKD61 as a material for the base material and Examples 17 and 18 used SKH51 as a material for the base material (SKD61 and SKH51 are both tool steels). As a method for forming the coating layer, the vacuum arc vapor deposition method was used for Examples 15 and 17, and the UBM sputtering method was used for Examples 16 and 18.

Comparative Examples 6 and 7 used SKD61 and SKI-151, respectively, as a material for the base material to fabricate a tool of the same shape as Examples 15 to 18. It should be noted that formation of the coating layer on the base material was not performed.

The friction stir welding tools of the above-described Examples 15 to 18 and Comparative Examples 6 to 7 were used to conduct a spot joining test and a linear joining test in a similar manner to Examples 1 to 14 and Comparative Examples 1 to 5. It should be noted that, as to the spot joining test, the test was conducted until 10,000 strokes of spot joining were done and meanwhile, whether or not the workpieces had adhered was confirmed for every 1,000 strokes of spot joining. As to the linear joining test, the test was conducted until a joint of 500 m was completed and meanwhile, whether or not the workpieces had adhered was confirmed for every 50 m joint. The results of the spot joining test are indicated under "spot joining evaluation" in Table 3, and the results of the linear joining test are indicated under "linear joining evaluation" in Table 3.

TABLE 3

| | base material | coating layer | | | spot joining evaluation | |
|---|---|---|---|---|---|---|
| | | | | | state of | |
| | type of material | crystal structure/composition | coating method | $I(WC_{1-x})/I(W_2C)$ | occurrence of adhesion | variation of probe diameter |
| Example 15 | SKD61 | cubic $WC_{1-x}$ + $W_2C$ | vacuum arc vapor deposition | 10.8 | no adhesion | 0.01 mm or less |
| Example 16 | SKD61 | cubic $WC_{1-x}$ + $W_2C$ | UBM sputtering | 11.2 | no adhesion | 0.01 mm or less |
| Example 17 | SKH51 | cubic $WC_{1-x}$ + $W_2C$ | vacuum arc vapor deposition | 11.6 | no adhesion | 0.01 mm or less |
| Example 18 | SKH51 | cubic $WC_{1-x}$ + $W_2C$ | UBM sputtering | 10.9 | no adhesion | 0.01 mm or less |
| Comparative Example 6 | SKD61 | — | — | — | adhesion occurred in 3000 strokes | — |
| Comparative Example 7 | SKH51 | — | — | — | adhesion occurred in 3000 strokes | — |

TABLE 3-continued

| | spot joining evaluation | | linear joining evaluation | | |
|---|---|---|---|---|---|
| | state of fracture | number of strokes for remaining thickness of lower workpiece to become 0.5 mm | state of occurrence of adhesion | variation of probe diameter | state of fracture |
| Example 15 | no damage | 1 | no adhesion | 0.01 mm or less | no damage |
| Example 16 | no damage | 1 | no adhesion | 0.01 mm or less | no damage |
| Example 17 | no damage | 1 | no adhesion | 0.01 mm or less | no damage |
| Example 18 | no damage | 1 | no adhesion | 0.01 mm or less | no damage |
| Comparative Example 6 | — | 1 | adhesion occurred in 150 m | — | — |
| Comparative Example 7 | — | 1 | adhesion occurred in 150 m | — | — |

As shown in Table 3, the friction stir welding tools of Examples 15 to 18 of the present invention had no adhesion of workpieces even after 10,000 strokes of spot joining under the spot joining test, and thus exhibited excellent adhesion resistance. In addition, the variation of the probe diameter after 10,000 strokes of spot joining was 0.01 mm or less, and no damage occurred to the probe portion and the screw thread portion. Thus, the tools exhibited excellent wear resistance and durability. Moreover, at the time when the first stroke of spot joining was done, the remaining thickness of the lower workpiece had reached 0.5 mm, and it was confirmed that joining was stably done all along from the initial stage after the start of joining.

The friction stir welding tools of Examples 15 to 18 of the present invention also had no adhesion of workpieces even after forming a joint of 500 m under the linear joining test, and thus exhibited excellent adhesion resistance. In addition, the variation of the probe diameter after the joint of 500 m was formed was also 0.01 mm or less, and no damage occurred to the probe portion and the screw thread portion. Thus, the tools exhibited excellent wear resistance and durability.

In contrast, the tools of Comparative Examples 6 and 7 having no coating layer formed thereon both had adhesion occurred when 3,000 strokes of spot joining were done under the spot joining test and had adhesion occurred when a joint of 150 m was formed under the linear joining test. Since adhesion occurred to these tools, the evaluations of the wear resistance and the chipping resistance were not done.

From the foregoing results, it has been confirmed that the friction stir welding tools of Examples 15 to 18 according to the present invention are superior in adhesion resistance, wear resistance, and chipping resistance as compared with the friction stir welding tools of Comparative Examples 6 and 7, and thus achieve stable joining all along from the initial stage after the start of joining.

While the embodiments and examples of the present invention have been described above, it is also originally intended to combine characteristics of the above-described embodiments and examples as appropriate.

It should be understood that the embodiments and examples disclosed herein are illustrative and not limitative in any respect. The scope of the present invention is defined by the terms of the claims, rather than the description above, and is intended to include any modifications within the scope and meaning equivalent to the terms of the claims.

REFERENCE SIGNS LIST 1 friction stir welding tool; 2 base material; 3 coating layer; 4 probe portion; 5 cylindrical portion; 6 shoulder portion; 7 chuck portion; 8 screw thread portion

The invention claimed is:

1. A friction stir welding tool used for friction stir welding, comprising:
a base material; and
a coating layer formed on a surface of at least a portion of said base material that is to be caused to contact workpieces during friction stir welding,
said coating layer containing cubic $WC_{1-x}$,
said base material being formed of a cemented carbide, and
said cemented carbide having a thermal conductivity of not more than 43 W/m·K.

2. The friction stir welding tool according to claim 1, wherein said base material contains WC having an average particle size of not less than 0.1 μm and not more than 1 μm.

3. The friction stir welding tool according to claim 1, wherein said base material contains not less than 3% by mass and not more than 15% by mass of Co.

4. The friction stir welding tool according to claim 1, wherein said coating layer is formed by a physical vapor deposition method.

5. The friction stir welding tool according to claim 1, wherein said coating layer subjected to x-ray diffraction has I $(WC_{1-x})$/I $(W_2C)$ of not less than 2, where I $(WC_{1-x})$ is a higher one of respective diffracted beam intensities of (111) diffracted beam and (200) diffracted beam, and I $(W_2C)$ is a highest one of respective diffracted beam intensities of (1000) diffracted beam, (0002) diffracted beam, and (1001) diffracted beam.

6. The friction stir welding tool according to claim 1, wherein friction stir welding by means of said friction stir welding tool is spot joining.

7. A method for manufacturing a friction stir welding tool including a base material and a coating layer, comprising the step of forming, by a physical vapor deposition method, said coating layer on a surface of at least a portion of said base material that is to be caused to contact workpieces,
said coating layer containing cubic $WC_{1-x}$,
said base material being formed of a cemented carbide, and
said cemented carbide having a thermal conductivity of not more than 43 W/m·K.

* * * * *